United States Patent [19]
Yang

[11] Patent Number: 5,482,873
[45] Date of Patent: Jan. 9, 1996

[54] METHOD FOR FABRICATING A BIPOLAR POWER TRANSISTOR

[75] Inventor: Sheng-Hsing Yang, Hsinchu, Taiwan

[73] Assignee: United Microelectronics Corporation, Hsinchu, Taiwan

[21] Appl. No.: 422,572

[22] Filed: Apr. 14, 1995

[51] Int. Cl.$^6$ ............................................. H01L 21/8222
[52] U.S. Cl. ............................ 437/31; 437/35; 437/162; 437/203; 148/DIG. 10
[58] Field of Search .............................. 437/31, 162, 35, 437/203, 78, 909, 915, 974; 148/DIG. 135, DIG. 123, DIG. 124, DIG. 10, DIG. 11

[56] References Cited

U.S. PATENT DOCUMENTS

| | | | |
|---|---|---|---|
| 4,415,371 | 11/1983 | Soclof | 437/35 |
| 4,980,302 | 12/1990 | Shimizu | 437/203 |
| 5,426,059 | 6/1995 | Queyssac | 437/31 |

*Primary Examiner*—Tuan H. Nguyen
*Attorney, Agent, or Firm*—Townsend and Townsend and Crew

[57] ABSTRACT

A method for fabricating a bipolar power transistor is disclosed, wherein the bipolar power transistor is made on a first type of heavily doped substrate. The method comprises the following steps of: sequentially forming a first type of doped layer, a first type of lightly doped layer, a second type of lightly doped layer, a second type of doped layer and a barrier layer on the first type of heavily doped substrate; forming an opening on a predetermined position of the barrier layer; using the barrier layer as a mask, then a first type of dopant being doped into the second type of doped layer by the opening and being driven in to form a first type of heavily doped region under the barrier layer; forming a recession thereon which extends to the second type of lightly doped layer through the second type of doped layer; doping a first type of dopant into the second type of doped layer and the second type of lightly doped layer in the recession to form a first type of doped region which surrounds the recession and is adjacent to the first type of heavily doped region; and forming a conductive layer in the recession, and doping a first type of dopant into the conductive layer, thereby the first type of dopant is diffused in the first type of heavily doped region and the first type of doped region to form a first type of diffused region.

6 Claims, 3 Drawing Sheets

METHOD FOR FABRICATING A BIPOLAR POWER TRANSISTOR

BACKGROUND OF THE INVENTION

1. Field of the Invention

The present invention relates to a method for fabricating a power device, and more particularly to a method for fabricating a bipolar power transistor.

2. Description of Prior Art

A prior-art bipolar power transistor shown in FIG. 1 comprises a heavily n-doped semiconductor substrate 1 for forming the collector of the bipolar power transistor; a n-type epitaxy layer 12 formed on the heavily n-doped semiconductor substrate 1; a p-type epitaxy layer 14 formed on the n-type epitaxy layer 12 for forming the base of the bipolar power transistor; a lightly n-doped region 16 formed on the p-type epitaxy layer 14; and a heavily n-doped region 18 formed on the lightly n-doped region 16 for forming the emitter of the bipolar power transistor. For increasing the current gain of the bipolar power transistor mentioned above, the emitter (i.e. the heavily n-doped region 18) is formed on the lightly n-doped region 16. However, due to a larger resistance provided in the lightly n-doped region 16, the secondary breakdown effect and the thermal effect will appear to reduce the switching speed of the bipolar power transistor when it is operated at a high current.

SUMMARY OF THE INVENTION

Accordingly, it is a general object of the present invention to provide an improved bipolar power transistor in which the above described problems are eliminated.

Another object of the present invention is to provide a manufacturing method for the improved bipolar power transistor.

An aspect of the present invention is that the diffusion region for forming the emitter of the bipolar power transistor is electrically connected with extended doped regions of the same type. In addition, to keep the same current gain, the heavily doped regions can be employed to increase the efficiency of heat dissipation and reduce the secondary breakdown effect so as to increase the switching speed while operating at a high current.

Other objects, features and advantages of the present invention will become apparent by way of the following detailed description of the preferred but non-limiting embodiment.

BRIEF DESCRIPTION OF THE DRAWINGS

The following detailed description, given by way of example and not intended to limit the invention solely to the embodiments described herein, will best be understood in conjunction with the accompanying drawings in which.

DETAILED DESCRIPTION OF THE PREFERRED EMBODIMENTS

The method of fabricating a bipolar power transistor of the present invention is illustrated in FIG. 2a to FIG. 2d. The bipolar power transistor is fabricated on a first type of semiconductor substrate 2 (e.g., a heavily n-doped substrate or a heavily p-doped substrate), and the substrate 2 functions as the collector of the bipolar power transistor. The fabricating method comprises the following steps:

STEP 1

Figure 1:
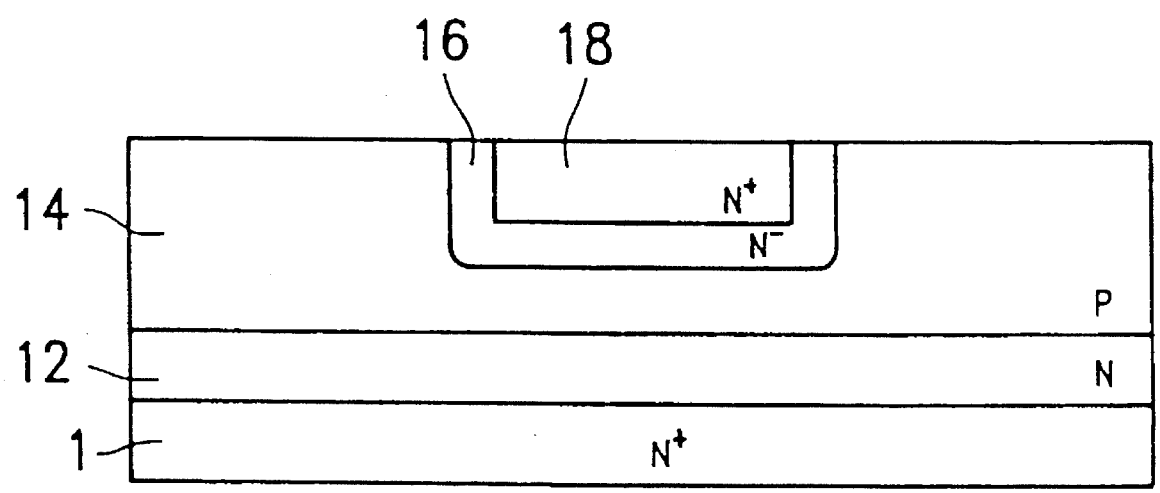
FIG. 1 schematically illustrates a cross-sectional diagram of a conventional bipolar power transistor.
Figure 2A:
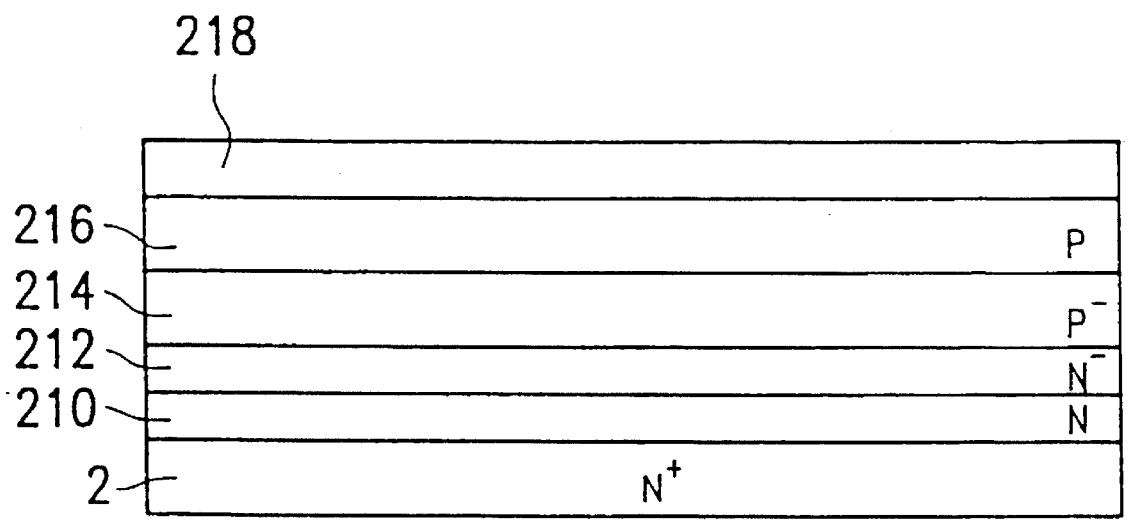
FIG. 2a–FIG. 2d are cross-sectional diagrams of a bipolar power transistor for illustrating the manufacturing procedures of the present invention.

As shown in FIG. 2a, a first type of doped layer 210, a first type of lightly doped layer 212, a second type of lightly doped layer 214, a second type of doped layer 216 and a barrier layer 218 are sequentially formed on the substrate 2. However, all of the first type of doped layer 210, the first type of lightly doped layer 212, the second type of lightly doped layer 214, and the second type of doped layer 216 can be formed by epitaxy. And the thickness of the first type of doped layer 210 is about 2–5 μm, the thickness of the first type of lightly doped layer 212 is about 5–20 μm, the thickness of the second type of lightly doped layer 214 is about 5–20 μm and the thickness of the second type of doped layer 216 is about 2–5 μm. Moreover, the barrier layer 218 can be an oxide layer formed by thermal oxidation.

STEP 2

Figure 2B:
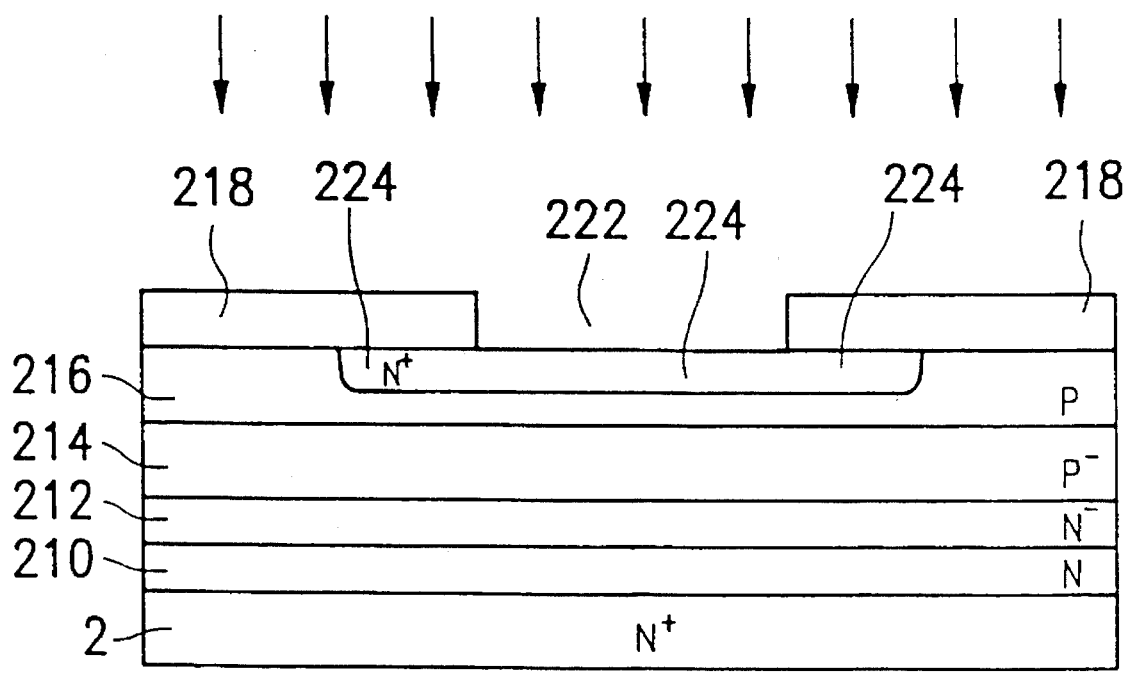

Referring to FIG. 2b, an opening 222 is formed on a predetermined position of the barrier layer 218. For instance, the opening 222 can be formed in procedures of photolithography and etching. That is, the barrier layer 218 is first patterned to define the position of the opening 222 by photolithography. Then the barrier layer 218 on the position of the opening 222 is etched away so as to form the opening 222. By using the barrier layer 218 as a mask, a first type of dopant is doped into the second type of doped layer 216 by the opening 222 and is driven in to form a first type of heavily doped region 224 under the barrier layer 218. The first type of dopant, however, can be arsenic ions implanted at an energy level of about 80–150 KeV with a dosage of about $5E14$–$5E15/cm^2$.

STEP 3

Figure 2C:
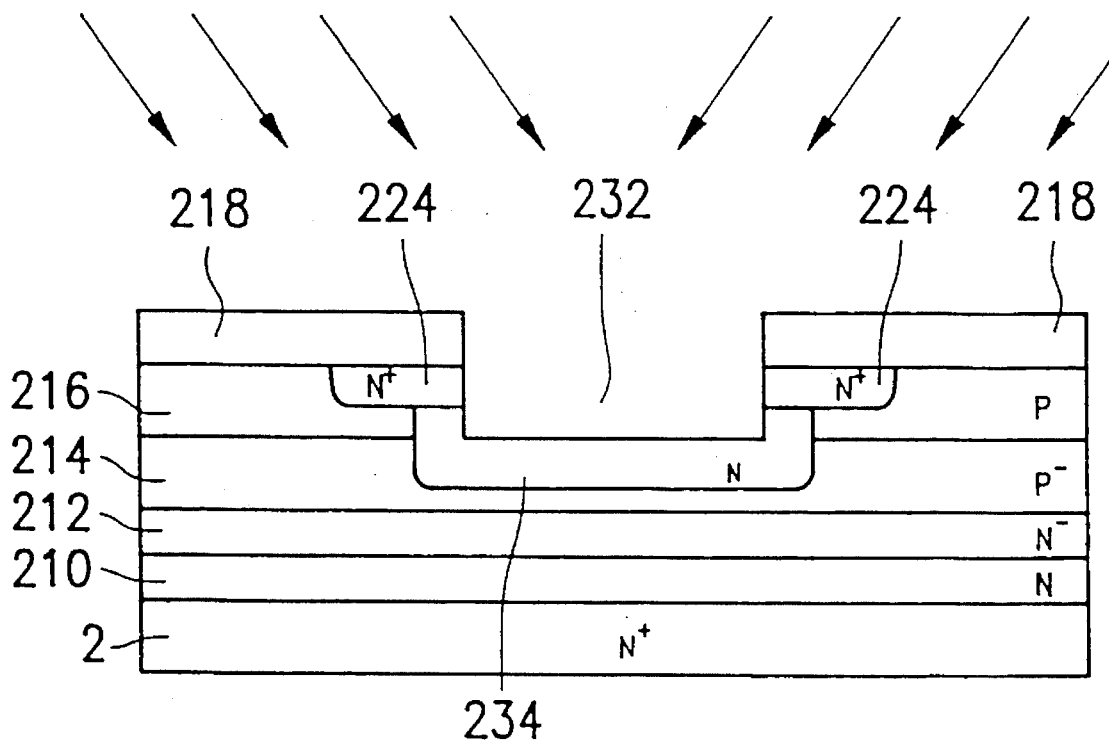

Turning to FIG. 2c, a recession 232 is formed by etching (e.g., Reaction Ion Etching) away the second type of doped layer 216 under the opening 222. The recession 232 extends to the second type of lightly doped layer 214 through the second type of doped layer 216. That is the depth of the recession 232 is larger than the thickness of the second type of doped layer 216. Thereafter, the second type of doped layer 216 and the second type of lightly doped layer 214 in the recession 232 are doped with a first type of dopant, e.g., phosphorous ions implanted at an energy level of about 150–180 KeV with a dosage of about $9E12$–$6E13/cm^2$, to form a first type of doped region 234. In addition, the first type of doped region 234 is formed around the recession 232 and is next to the first type of heavily doped region 224. That is, the first type of dopant is implanted in the recession 232 of a predetermined large angle (e.g., 10 degrees to the normal direction of the substrate).

STEP 4

Figure 2D:
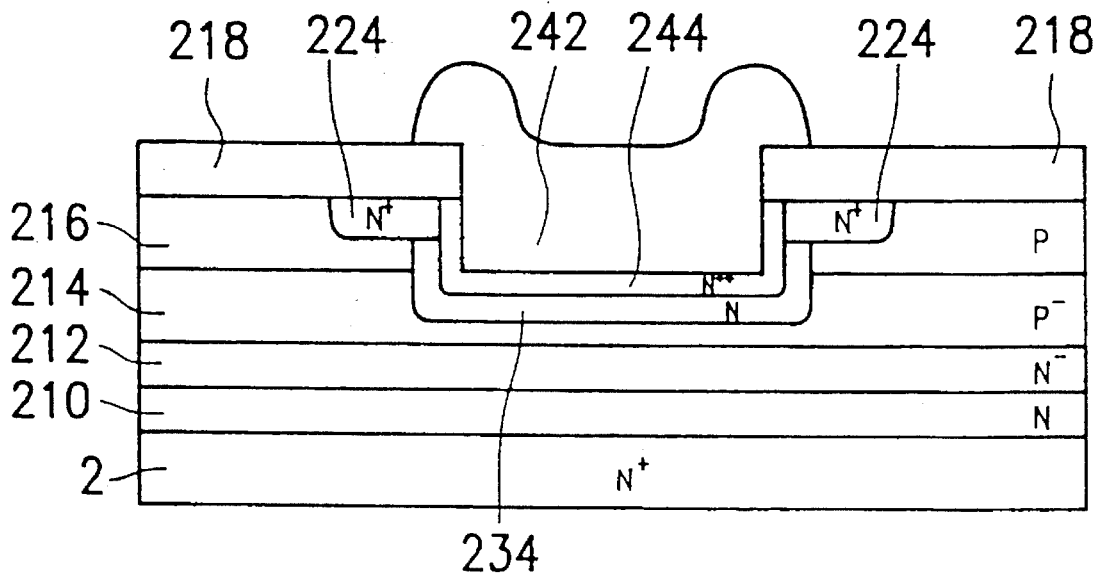

Reference is now made to FIG. 2d. A conductive layer 242 such as polysilicon is formed in the recession 232. A first type of dopant such as arsenic ion is then implanted in the conductive layer 242 at an energy level of about 80–150 KeV with a dosage larger than $5E15/cm^2$. Thereafter, the first type of dopant is diffused into the first type of heavily doped region 224 and the first type of doped region 234 to form a first type of diffused region 244 which functions as the emitter of the bipolar power transistor.

It should be noted that the first type and the second type described above can be p-type and n-type respectively or n-type and p-type. As shown in the drawings, for example, the first type of doped layer 210 is a n-type region, the first type of lightly doped layer 212 is a n--type region, the second type of lightly doped layer 214 is a p--type region, the second type of doped layer 216 is a p-type region, the first type of heavily doped region 224 is a n+-region, and the first type of diffused region 244 is a n++-type region.

According to the fabricating method of the present invention, the bipolar power transistor will retain the same current gain because the diffused region (i.e., the emitter) of the bipolar power transistor is connected with extended regions of the same doped type. In addition, the heavily doped regions can be employed to increase the efficiency of heat dissipation and reduce the secondary breakdown effect so as to increase the switching speed while operating at a high current.

Further, the present invention is not limited to the above described embodiment, and variations and modifications may be made without departing from the scope of the present invention.

What is claimed is:

1. A method for fabricating a bipolar power transistor which is made on a first type of heavily doped substrate serving as a collector of said bipolar power transistor, the method comprising the following steps of:

forming a first type of doped layer, a first type of lightly doped layer, a second type of lightly doped layer, a second type of doped layer and a barrier layer on said first type of heavily doped substrate sequentially;

forming an opening on a position of said barrier layer;

using the barrier layer as a mask, a first type of dopant being doped into said second type of doped layer by said opening and being driven in to form a first type of heavily doped region under said barrier layer;

using said barrier layer as a mask, forming a recession thereon by etching said second type of doped layer through said opening, said recession extending to said second type of lightly doped layer through said second type of doped layer;

doping a first type of dopant into said second type of doped layer and said second type of lightly doped layer in said recession to form a first type of doped region, said first type of doped region surrounding said recession and being adjacent to said first type of heavily doped region; and forming a conductive layer in said recession, and doping a first type of dopant into said conductive layer, whereby said first type of dopant is diffused in said first type of heavily doped region and said first type of doped region to form a first type of diffused region serving as an emitter of said bipolar power transistor, wherein the doping concentration of said first type of diffused region is greater than that of said first type of heavily doped region.

2. A method for fabricating a bipolar power transistor as claimed in claim 1 wherein said conductive layer is made of polysilicon.

3. A method for fabricating a bipolar power transistor as claimed in claim 2 wherein said barrier layer is an oxide layer.

4. A method for fabricating a bipolar power transistor as claimed in claim 3 wherein all of said doped layers are formed by epitaxy.

5. A method for fabricating a bipolar power transistor as claimed in claim 4 wherein said first type is n-type and said second type is p-type.

6. A method for fabricating a bipolar power transistor as claimed in claim 4 wherein said first type is p-type and said second type is n-type.

* * * * *